US008680599B2

(12) United States Patent
Mitsuyama et al.

(10) Patent No.: US 8,680,599 B2
(45) Date of Patent: Mar. 25, 2014

(54) SEMICONDUCTOR DEVICE AND METHOD OF MANUFACTURING THE SAME

(75) Inventors: Hiroshi Mitsuyama, Itami (JP); Yasuhisa Fujii, Itami (JP); Keiichi Yamada, Kanagawa (JP)

(73) Assignee: Renesas Electronics Corporation, Kangawa (JP)

( * ) Notice: Subject to any disclaimer, the term of this patent is extended or adjusted under 35 U.S.C. 154(b) by 392 days.

(21) Appl. No.: 13/207,002

(22) Filed: Aug. 10, 2011

(65) Prior Publication Data

US 2012/0049369 A1 Mar. 1, 2012

(30) Foreign Application Priority Data

Aug. 27, 2010 (JP) ................................. 2010-190754

(51) Int. Cl.
*H01L 27/108* (2006.01)
*H01L 21/8242* (2006.01)

(52) U.S. Cl.
USPC ........... 257/303; 257/306; 257/532; 257/758; 257/E21.008; 257/E21.016; 257/E21.021; 257/E21.584; 257/E23.16; 438/244; 438/393; 438/396

(58) Field of Classification Search
None
See application file for complete search history.

(56) References Cited

U.S. PATENT DOCUMENTS

| 6,342,734 | B1 * | 1/2002 | Allman et al. ................ 257/758 |
| 6,518,142 | B2 | 2/2003 | Yamamoto | |
| 6,821,839 | B2 * | 11/2004 | Chung .......................... 438/240 |
| 7,078,785 | B2 | 7/2006 | Ciancio et al. | |
| 7,157,738 | B2 | 1/2007 | Sato et al. | |
| 7,235,454 | B2 * | 6/2007 | Kim et al. ...................... 438/396 |
| 2005/0062130 | A1 * | 3/2005 | Ciancio et al. ................ 257/532 |
| 2007/0262417 | A1 | 11/2007 | Ohtake et al. | |
| 2009/0014835 | A1 * | 1/2009 | Furumiya et al. ............. 257/535 |
| 2010/0091428 | A1 * | 4/2010 | Kim et al. ...................... 361/313 |
| 2010/0279484 | A1 * | 11/2010 | Wang et al. ................... 438/396 |

FOREIGN PATENT DOCUMENTS

| JP | 11-111947 | 4/1999 |
| JP | 2001-210787 | 8/2001 |
| JP | 2002-203915 | 7/2002 |
| JP | 2007-515775 | 6/2007 |
| JP | 2007-188935 | 7/2007 |
| JP | 2007-305654 | 11/2007 |
| JP | 2008-016464 | 1/2008 |
| JP | 2008-270407 | 11/2008 |

\* cited by examiner

*Primary Examiner* — Alonzo Chambliss
(74) *Attorney, Agent, or Firm* — McDermott Will & Emery LLP

(57) ABSTRACT

To provide a more reliable semiconductor device including a lower-cost and more reliable capacitor and a method of manufacturing the same. This manufacturing method comprises the steps of: preparing a semiconductor substrate; and forming, over one of the major surfaces of the semiconductor substrate, a first metal electrode including an aluminum layer, a dielectric layer over the first metal electrode, and a second metal electrode over the dielectric layer. In the step of forming the first metal electrode, the aluminum layer is formed so that the surface thereof satisfies a relationship of Rmax<80 nm, Rms<10 nm, and Ra<9 nm. The step of forming the first metal electrode comprises the steps of: forming at least one first barrier layer; forming the aluminum layer over the first barrier layer; and recrystallizing a crystal constituting the aluminum layer.

9 Claims, 15 Drawing Sheets

US 8,680,599 B2

SEMICONDUCTOR DEVICE AND METHOD OF MANUFACTURING THE SAME

CROSS-REFERENCE TO RELATED APPLICATION

The disclosure of Japanese Patent Application No. 2010-190754 filed on Aug. 27, 2010 including the specification, drawings and abstract is incorporated herein by reference in its entirety.

BACKGROUND

The present invention relates to a semiconductor device and a method of manufacturing the same, and more specifically relates to a semiconductor device including a MIM capacitor and a method of manufacturing the same.

The MIM (Metal Insulation Metal) capacitor is a capacitive element which can be formed in a semiconductor device having a multilayer interconnection structure. The capacitive element usually used in a semiconductor device includes a gate capacitor and the MIM capacitor. In the MIM capacitor, as compared with the gate capacitor, there is less need to increase the occupied area in the plane view of a semiconductor device itself in increasing the electric capacity of the capacitor. Moreover, the MIM capacitor has a small parasitic component as compared with the gate capacitor and is thus excellent in high frequency characteristics.

For this reason, there are increasingly more cases where the MIM capacitor is used in semiconductor devices. In order to suppress an initial failure of the MIM capacitor, it is very important to secure the flatness of a lower electrode constituting the MIM capacitor.

With an increase in the capacity of the MIM capacitor in recent years, it is predicted that the film thickness of a dielectric layer is thinned and that the area of the respective lower electrode and upper electrode in the plane view increases. As a result, the variation in the breakdown voltage of the MIM capacitor may increase and the failure (initial failure) due to this variation may increase.

The MIM capacitor is a capacitive element comprising a dielectric layer sandwiched by a lower electrode and an upper electrode. Usually, an insulative metal nitride film, nitride film, oxide film, or oxynitride film is used for the dielectric layer. Usually, the lower electrode comprises a copper-doped aluminum alloy whose lower portion and upper portion are sandwiched by at least one barrier layer comprising titanium nitride (TiN) or titanium metal (Ti).

In order to suppress the variation in the breakdown voltage of the MIM capacitor and improve the reliability of the MIM capacitor, the following two methods are considered to be used. One is a method of improving the reliability of the dielectric layer itself. The other one is a method of optimizing, for example, further flattening, the lower electrode corresponding to a stacked film layer in which the dielectric layer is to be stacked.

The above-described method of optimizing the lower electrode is disclosed, for example, in the following patent documents: Japanese Patent Laid-Open No. 2002-203915 (Patent Document 1); Japanese Patent Laid-Open No. 11-111947 (Patent Document 2); Japanese Patent Translation Publication No. 2007-515775 (Patent Document 3); Japanese Patent Laid-Open No. 2008-16464 (Patent Document 4); Japanese Patent Laid-Open No. 2008-270407 (Patent Document 5); Japanese Patent Laid-Open No. 2007-305654 (Patent Document 6); Japanese Patent Laid-Open No. 2007-188935 (Patent Document 7); and Japanese Patent Laid-Open No. 2001-210787 (Patent Document 8).

SUMMARY

However, either one of the manufacturing methods disclosed in the above-described patent documents is a method of forming the lower electrode once and thereafter applying a process for planarizing the surface of the formed lower electrode. Specifically, Patent Document 1 discloses a method of planarizing the surface of a lower electrode by sputter etching the surface of the formed lower electrode. Patent Document 2 discloses a technique for planarizing the surface of a formed lower electrode by CMP (Chemical Mechanical Polishing).

Patent Document 3 discloses a technique for separately forming a conductive smoothing layer over the surface of a formed lower electrode in order to further planarize the uppermost surface of the lower electrode. Patent Document 4 discloses a method, in which a lower layer serving as the base of the lower electrode is formed and subsequently a conductive metal nitride film is formed over the lower layer, thereby suppressing the interface reaction of the conductive metal nitride film with a capacitance insulating film and improving the reliability of the MIM capacitor. Patent Document 5 discloses a technique, wherein a semiconductor substrate and a conductive film forming stage are contacted each other in a pressed state so that the charges generated in forming the upper electrode are prevented from being accumulated in the surface of the semiconductor substrate. Patent Document 6 discloses a technique, wherein a tantalum (Ta) film is formed over the surface of a formed lower electrode so as to suppress a current leak between electrodes. Patent Document 7 discloses a method, in which an oxidation process is applied onto the surface of a formed lower electrode so as to improve the crystal orientation of the lower electrode at the interface between the lower electrode and the capacitance insulating film. Patent Document 8 discloses a technique for suppressing the leakage current of a lower electrode by chemical-solution cleaning the surface of the formed lower electrode.

If the lower electrode itself is formed and subsequently a process of planarizing the lower electrode or suppressing the leakage current is performed, the number of steps may increase accordingly, possibly resulting in an increase in the cost. Moreover, for example, as with Patent Document 4, in cases where the lower electrode itself is planarized in the final step of forming the lower electrode itself (step of forming the conductive metal nitride film), for example, when the surface roughness of the lower electrode constituting portion which is formed prior to the conductive metal nitride film is poor, even if the conductive metal nitride film is formed flat, the flatness of the entire lower electrode may degrade by inheriting the effect of the surface roughness of the constituting portion. In this case, it may be difficult to improve the reliability of the MIM capacitor.

The present invention has been made in view of the above circumstances, and provides a more reliable semiconductor device including a lower-cost and more reliable MIM capacitor, and also provides a method of manufacturing the same.

The semiconductor device according to an example of the present invention has the following configuration. This semiconductor device comprises: a semiconductor substrate with a major surface; a first metal electrode formed over the major surface of the semiconductor substrate; a dielectric layer formed over the first metal electrode; and a second metal electrode formed over the dielectric layer. The first metal electrode includes at least one first barrier layer, and a first aluminum layer containing aluminum formed over the first barrier layer. The surface of the first aluminum layer satisfies a relationship of Rmax<80 nm, Rms<10 nm, and Ra<9 nm.

A method of manufacturing a semiconductor device according to an example of the present invention comprises the following steps. First, a semiconductor substrate is prepared. Over one of the major surfaces of the semiconductor substrate, a first metal electrode including a first aluminum layer containing aluminum is formed. A dielectric layer is formed over the first metal electrode. A second metal electrode is formed over the dielectric layer. In the step of forming the first metal electrode, the first aluminum layer is formed so that the surface of the first aluminum layer satisfies a relationship of Rmax<80 nm, Rms<10 nm, and Ra<9 nm.

According to this example, a semiconductor device including a MIM capacitor with an improved flatness of the surface of the first aluminum layer constituting the first metal electrode is provided. Therefore, even if the barrier layer, the dielectric layer, or the like is formed over the first aluminum layer, the variation in the film thickness of the dielectric layer of the MIM capacitor can be suppressed. For this reason, the variation in the initial breakdown voltage of the MIM capacitor or an initial failure can be suppressed, and as a result, the reliability of the semiconductor device including the MIM capacitor reliably improves.

According to the manufacturing method of this example, the MIM capacitor is formed so that the flatness of the surface of the first aluminum layer constituting the first metal electrode is improved. For this reason, even if the barrier layer is formed over the first aluminum layer and furthermore, the dielectric layer, the second metal electrode, and the like are formed over the first aluminum layer, the variation in the film thickness of the dielectric layer of the MIM capacitor can be suppressed. Therefore, the variation in the initial breakdown voltage of the MIM capacitor or the initial failure can be suppressed, and thus the reliability of the semiconductor device including the MIM capacitor improves.

DETAILED DESCRIPTION

Hereinafter, embodiments of the present invention will be described with reference to the accompanying drawings.

Embodiment 1

Figure 1:
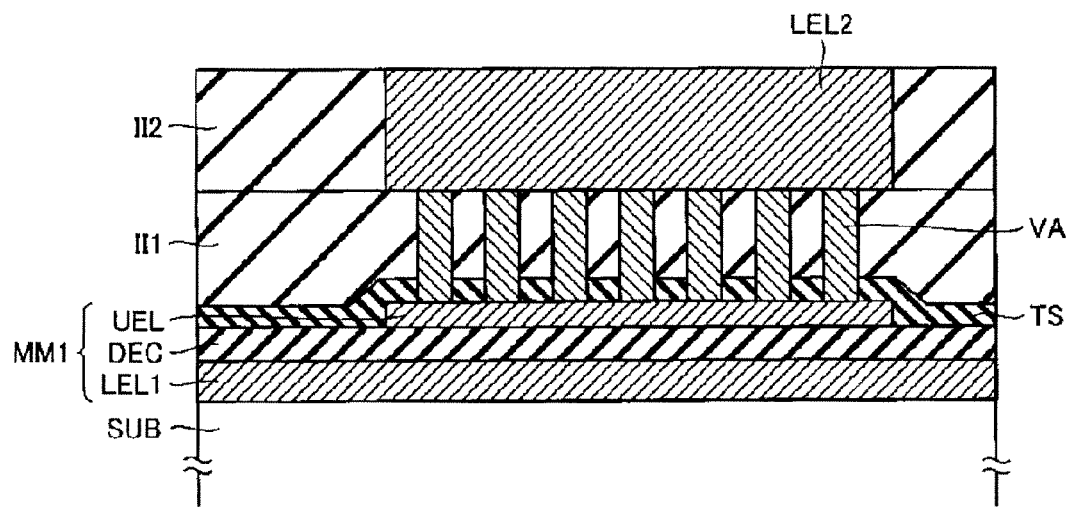
FIG. 1 is a schematic cross-sectional view showing an example of the configuration of a MIM capacitor mounted on a semiconductor device according to Embodiment 1 of the present invention.

A semiconductor device of this embodiment includes a MIM capacitor. Referring to FIG. 1, the capacitor MM1 (MIM capacitor) includes a lower electrode LEL1 (a first metal electrode), a dielectric layer DEC, and an upper electrode UEL (a second metal electrode).

The capacitor MM1 is formed over one of the major surfaces of a semiconductor substrate SUB comprising a semiconductor material, for example, such as silicon, and having a thin film, an element, and the like formed in one of the major surfaces. That is, here, the semiconductor substrate SUB shall mean both a semiconductor substrate itself and a semiconductor substrate having a thin film and the like formed therein.

Therefore, another capacitor may be formed on a lower portion (the lower side in FIG. 1 and FIG. 2) or an upper portion (the upper side in FIG. 1 and FIG. 2) of the capacitor MM1. An insulating film TS, an interlayer insulating film II1, and an interlayer insulating film II2 are formed on the upper portion of the capacitor MM1. In a layer at the same height as the interlayer insulating film II2, a lower electrode LEL2 constituting another capacitor is formed.

The insulating film TS may be formed on the upper portion of the capacitor MM1. A conductive via VA is formed so as to extend through the insulating film TS and the interlayer insulating film II1. Through the conductive via VA, an upper electrode UEL of the capacitor MM1 is electrically conducted to a lower electrode LEL2 of another capacitor. It should be noted that the insulating film TS may not be formed.

Figure 2:
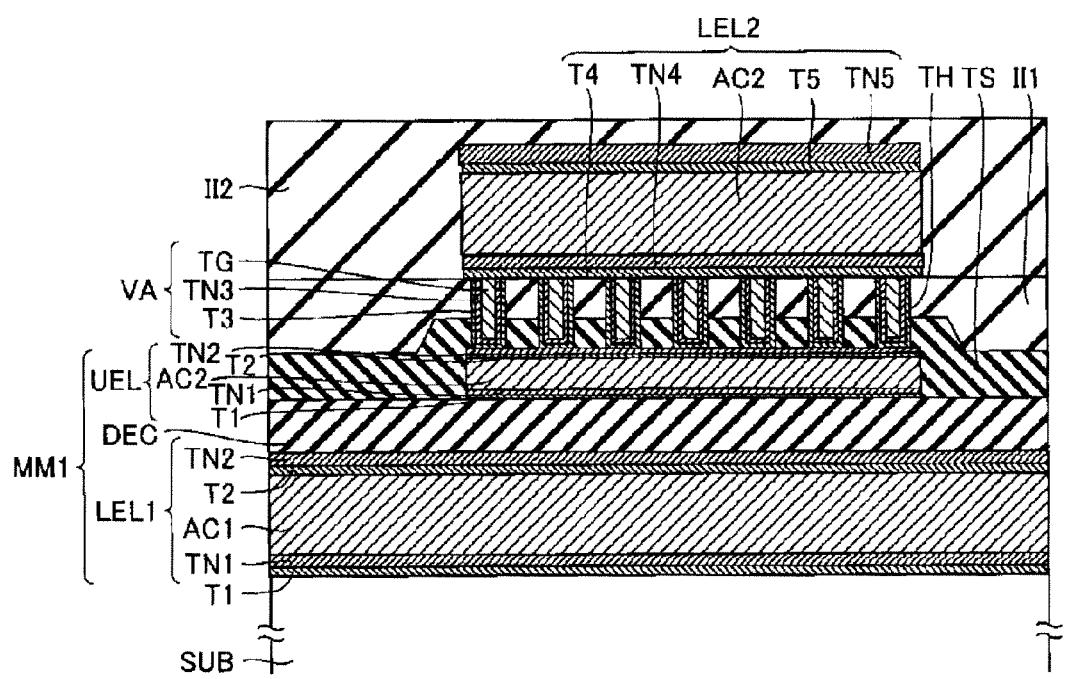
FIG. 2 is a schematic cross-sectional view depicting in more detail the configuration of a lower electrode, an upper electrode, and the like of the MIM capacitor of FIG. 1.

Referring to FIG. 2, the lower electrode LEL1 comprises a titanium layer T1 (a first barrier layer), a titanium nitride layer TN1 (a first barrier layer), an aluminum alloy layer AC1 (a first aluminum layer), a titanium layer T2 (a second barrier layer), and a titanium nitride layer TN2 (a second barrier layer) stacked in this order. In the conductive via VA, the side surface and bottom surface of a through-hole TH which is formed so as to extend through the insulating film TS and the interlayer insulating film II1 from the upper side to lower side thereof are covered with a titanium layer T3 and a titanium nitride layer TN3, and the inside of the through-hole TH is filled with a tungsten layer TG. Moreover, the lower electrode LEL2 comprises a titanium layer T4, a titanium nitride layer TN4, an aluminum alloy layer AC2, a titanium layer T5, and a titanium nitride layer TN5 stacked in this order.

The lower electrodes LEL1 and LEL2 of the capacitor MM1 preferably include an aluminum layer which is a portion comprising a material containing aluminum, like the aluminum alloy layers AC1 and AC2. Moreover, the aluminum alloy layers AC1 and AC2 may contain a metallic material, for example, such as copper.

It should be noted that the aluminum alloy layers AC1 and AC2 more preferably contain copper in a proportion in a range from 0.5% by mass to 1.0% by mass, for example. That is, the aluminum alloy layers AC1 and AC2 preferably comprise an alloy mainly comprising aluminum. Moreover, the aluminum alloy layers AC1 and AC2 each may be an alloy containing both copper and silicon (Si).

For example, as the first barrier layer arranged on the lower side of the aluminum alloy layers AC1 and AC2 like the titanium nitride layers TN1 and TN4, the titanium layers T1, T2 comprising titanium other than the titanium nitride layers TN1 and TN4 comprising titanium nitride may be used. Thus, the first barrier layer preferably comprises a material containing titanium. In this manner, the reliability in wiring of the lower electrodes LEL1 and LEL2 can be increased. However, as the first barrier layer, a thin film comprising tantalum or a tantalum-based material, such as tantalum nitride (TaN), may be used.

The first barrier layer preferably has one or more layers of thin film containing titanium or the like arranged therein, and more preferably comprises a plurality of thin films stacked. For this reason, in FIG. 2, the titanium layer T1 and the titanium nitride layer TN1 are stacked as the first barrier layer.

Figure 3:
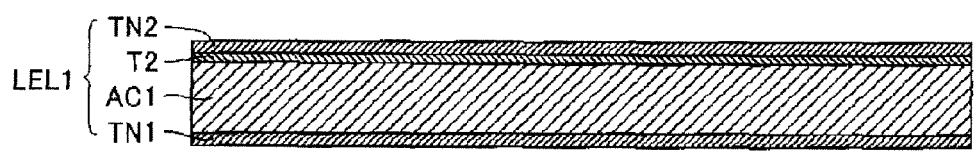
FIG. 3 is a schematic cross-sectional view showing an example of an alternative embodiment of the lower electrode of the MIM capacitor of FIG. 2.

Referring to FIG. 3, for example, the first barrier layer of the lower electrode LEL1 may include only one titanium nitride layer TN1. Moreover, also with regard to the lower electrode LEL2, one titanium nitride layer TN4 and one titanium nitride layer TN5 may be stacked on the lower portion and upper portion of the aluminum alloy layer AC2, respectively.

In FIG. 2, the second barrier layer comprises the stacked titanium layer T2 and titanium nitride layer TN2. However, the second barrier layer comprising the titanium layer T2 and titanium nitride layer TN2 may also comprise only one titanium nitride layer TN2, for example. As described over, the first and second barrier layers preferably comprise a material containing titanium. However, as the second barrier layer, a thin film comprising tantalum or a tantalum-based material, such as tantalum nitride (TaN), may be used.

Other than this, for example, the dielectric layer DEC is preferably the one comprising an insulative metal nitride film, nitride film, oxide film, or oxynitride film, and is particularly preferably the one comprising P—SiN. It should be noted that P—SiN is a thin film of silicon nitride (SiN) formed by plasma CVD (Chemical Vapor Deposition).

As the insulating film TS, an insulating film comprising P-TEOS (tetrethoxy silane) is preferably used. P-TEOS is a thin film of tetraethoxy silane formed by plasma CVD.

Figure 4:
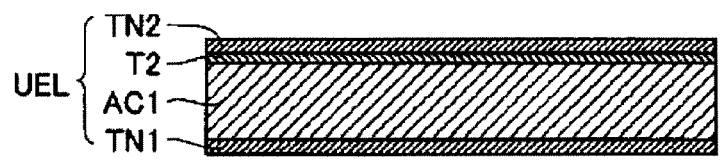
FIG. 4 is a schematic cross-sectional view showing an example of an alternative embodiment of the upper electrode of the MIM capacitor of FIG. 2.

As illustrated in FIG. 2, the upper electrode UEL, as with the lower electrode LEL1, may include the aluminum alloy layer AC1 (the second aluminum layer), wherein the lower side thereof is covered with the titanium layer T1 (a third barrier layer) and the titanium nitride layer TN1 (a third barrier layer) and the upper side thereof is covered with the titanium layer T2 and the titanium nitride layer TN2. Moreover, referring to FIG. 4, also with regard to the upper electrode UEL, only the titanium nitride layer TN1 may be formed on the lower side of the aluminum alloy layer AC1.

In the conductive via VA formed inside the through-hole TH, the titanium layer T3 and the titanium nitride layer TN3 are arranged as the barrier layer of the conductive via VA, for example as with the titanium layer T1, the titanium nitride layer TN1, or the like. The inside of the conductive via VA is preferably filled with the tungsten layer TG mainly comprising tungsten.

Furthermore, the interlayer insulating films II1 and II2 preferably comprise a silicone oxide film ($SiO_2$) and the like.

In the capacitor MM1 of this embodiment described above, as described later, the surface of the aluminum alloy layer AC1 constituting the lower electrode LEL1 is made flatter. Specifically, it is preferable that Rmax (maximum height) is less than 80 nm, Rms (root-mean-square roughness) is less than 10 nm, and Ra (arithmetic average roughness) is less than 9 nm, the Rmax, Rms and Ra indicating the surface roughness of the aluminum alloy layer AC1. It should be noted that the surface of the aluminum alloy layer AC1 of the upper electrode UEL or the aluminum alloy layer AC2 of the lower electrode LEL2 preferably exhibits the roughness in the range described above.

Figure 5:
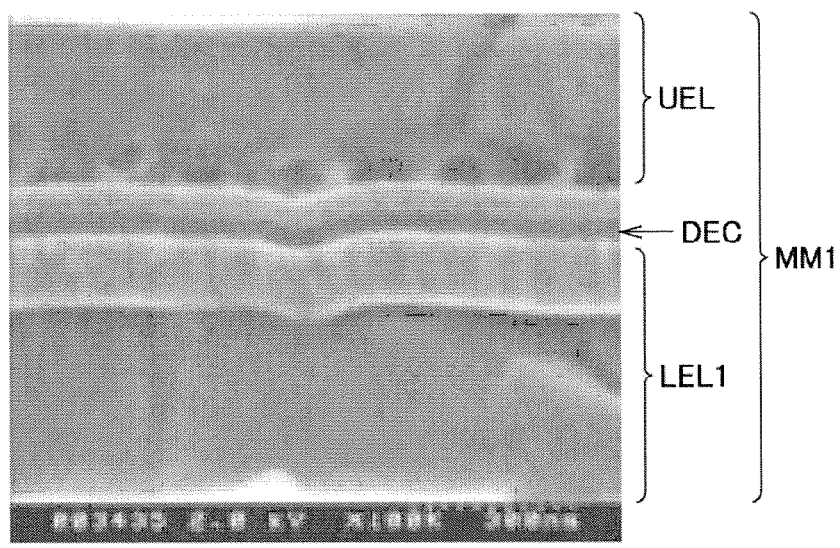
FIG. 5 is a cross-sectional photograph of a MIM capacitor including the lower electrode with high flatness, like the MIM capacitor according to Embodiment 1 of the present invention.
Figure 6:
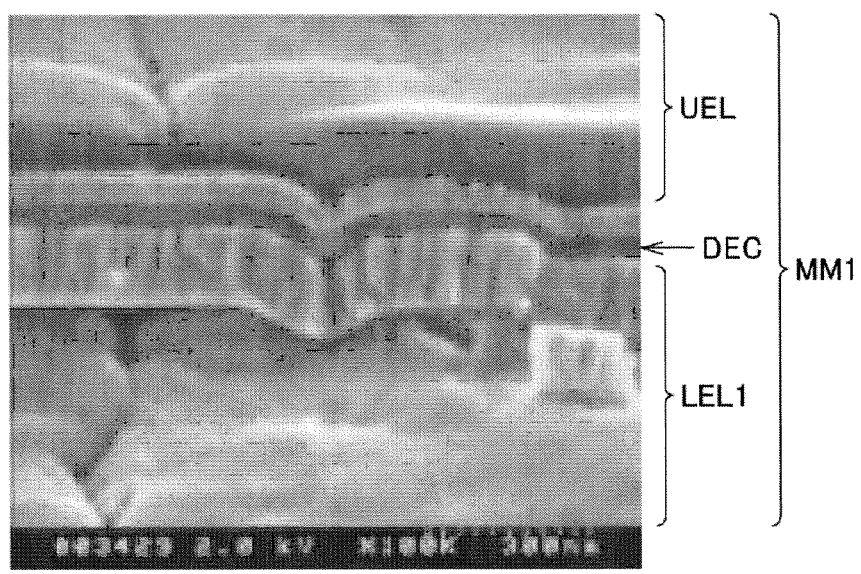
FIG. 6 is a cross-sectional photograph of a MIM capacitor including the lower electrode with low flatness, as a comparative example of Embodiment 1 of the present invention.

The cross-sectional photographs of FIG. 5 and FIG. 6 were taken using SEM (Scanning Electron Microscope). Referring to FIG. 5, if the flatness of the surface of the lower electrode LEL1 improves, the flatness of the dielectric layer DEC and upper electrode UEL deposited thereover is also improved. Accordingly, the flatness of the entire capacitor MM1 is improved, and the variation in the breakdown voltage of the capacitor MM1 due to the variation in the thickness of the dielectric layer DEC of the capacitor MM1 or the variation in the thickness of the dielectric layer DEC can be suppressed. As a result, the occurrence rate of an initial failure among a plurality of capacitors MM1 mounted on the semiconductor device is reduced.

If the aluminum alloy layer AC1 is planarized, the unevenness of the dielectric layer DEC is reduced and therefore the possibility of the occurrence of stress concentration onto the dielectric layer DEC is reduced. Then, the film quality of the dielectric layer DEC locally varies and the possibility of the degradation of stress resistance of the dielectric layer DEC is reduced.

In contrast, referring to FIG. 6, when the flatness of the surface of the lower electrode LEL1 is low and has a lot of unevenness, the flatness of the dielectric layer DEC and upper electrode UEL deposited over the lower electrode LEL1 is also reduced in accordance with the flatness of the surface of the lower electrode LEL1. In addition, the coverage of the dielectric layer DEC may degrade, the film quality of the dielectric layer DEC may degrade due to the stress concentration locally occurring in the dielectric layer DEC, or the stress resistance of the dielectric layer DEC may degrade. Furthermore, in this case, the variation in the breakdown voltage of the capacitor MM1 due to the variation in the thickness of the dielectric layer DEC of the capacitor MM1 or the variation in the thickness of the dielectric layer DEC increases. Therefore, the occurrence rate of an initial failure of the capacitor MM1 may increase.

The aluminum alloy layer AC1 with high flatness as described above can be formed by recrystallizing the aluminum crystal in the aluminum alloy layer AC1 after depositing the aluminum alloy layer AC1. That is, by reflowing the deposited aluminum alloy layer AC1 at a high temperature, the aluminum crystal in the aluminum alloy layer AC1 is recrystallized. Specifically, for example, a reflow process is preferably performed for keeping the semiconductor substrate SUB, in which the aluminum alloy layer AC1 is formed, at 420° C. or more.

By examining the orientation with respect to the (111) plane of the aluminum crystal in the aluminum alloy layer AC1, whether or not the planarization of the aluminum alloy layer AC1 by the reflow process or the like has been successfully performed can be verified.

Figure 7:
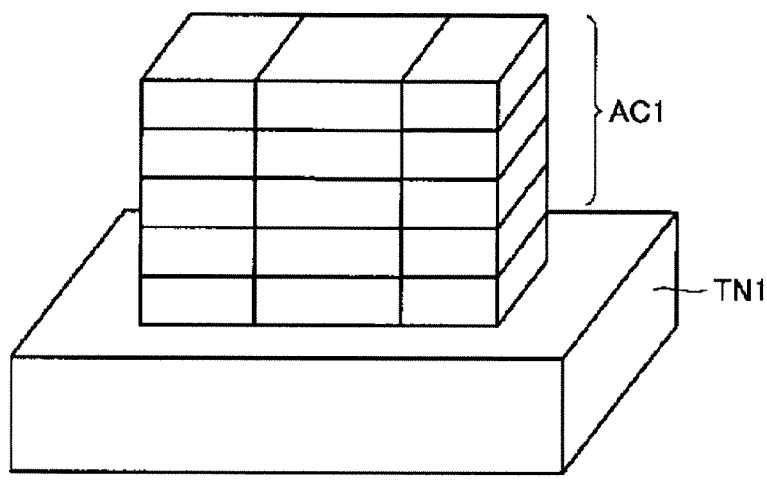
FIG. 7 is a schematic diagram showing the configuration of the aluminum crystal having a high (111) orientation strength formed over a barrier layer.

Referring to FIG. 7, for example, if crystal grains constituting the crystal structure of the aluminum alloy layer AC1 formed over the titanium nitride layer TN1 of the lower electrode LEL1 are arranged at the same plane spacing or with the same number of in-plane atoms in the (111) plane, the growth (i.e., deposition) of the crystal proceeds in substantially the same direction. As a result, the (111) orientation strength of the formed crystal becomes increased. This is because the deposition proceeds in substantially the same direction and at a substantially constant speed. In this case, the flatness of the surface of the formed thin film (the aluminum alloy layer AC1) improves.

Figure 8:
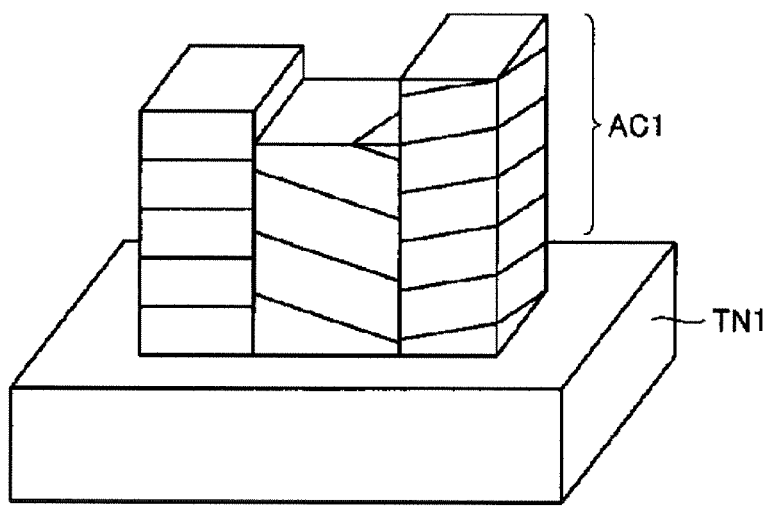
FIG. 8 is a schematic diagram showing the configuration of the aluminum crystal having a low (111) orientation strength formed over the barrier layer.

In contrast, referring to FIG. 8, if crystal grains constituting the crystal structure of the aluminum alloy layer AC1 are arranged at a different plane spacing or with a different number of in-plane atoms in the (111) plane, the deposition rate does not become constant and the flatness of the deposited thin film degrades. In this manner, the (111) orientation strength of the formed crystal structure becomes decreased. In this case, the flatness of the surface of the formed thin film (aluminum alloy layer AC1) is reduced.

Next, a method of manufacturing the capacitor MM1 particularly illustrated in FIG. 2 of the semiconductor device according to this embodiment will be described.

Figure 9:
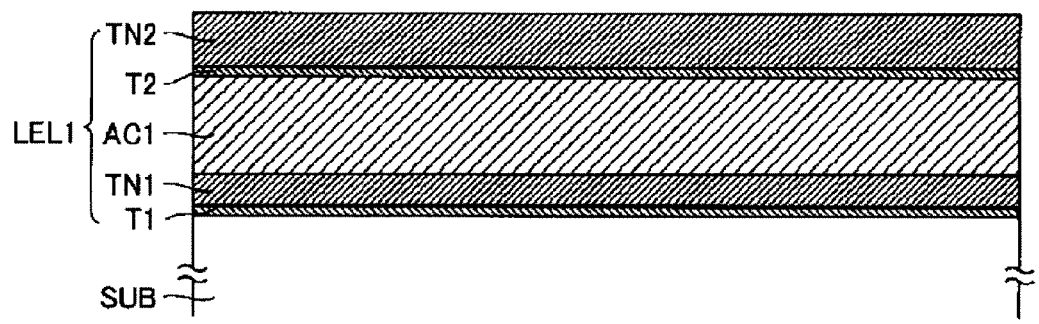
FIG. 9 is a schematic cross-sectional view showing an aspect of the first step of a method of manufacturing the semiconductor device of FIG. 2.

Referring to FIG. 9, the titanium layer T1, the titanium nitride layer TN1, the aluminum alloy layer AC1, the titanium layer T2, and the titanium nitride layer TN2 for forming the lower electrode LEL1 constituting the capacitor MM1 are stacked in this order over the semiconductor substrate SUB, in which a thin film, an element, and the like are formed. Specifically, for example, a pre-process such as sputter etching is applied onto the major surface, in which the lower electrode LEL1 is to be formed, and subsequently the titanium layer T1, the titanium nitride layer TN1, and the aluminum alloy layer AC1 are formed in this order by sputtering, for example.

Here, in forming the aluminum alloy layer AC1, preferably, the aluminum alloy layer AC1 containing copper in a range from 0.5% by mass to 1.0% by mass is deposited first while the temperature of the semiconductor substrate SUB is controlled to a range from 50° C. to 150° C. Preferably, the reflow process is subsequently performed so that the semiconductor substrate SUB (the aluminum alloy layer AC1) is heated to a temperature of 420° C. or more. The crystal of aluminum which was deposited once is recrystallized by this heating, and thus the (111) orientation strength increases and the flatness of the surface improves.

The aluminum alloy layer AC1 is formed and is also recrystallized. Therefore, the (111) orientation strength of the crystal of the aluminum alloy layer AC1 increases and the flatness of the surface improves.

Next, over the aluminum alloy layer AC1, the titanium layer T2 and the titanium nitride layer TN2 are stacked in this order by sputtering, for example, and serve as the lower electrode LEL1.

Figure 10:
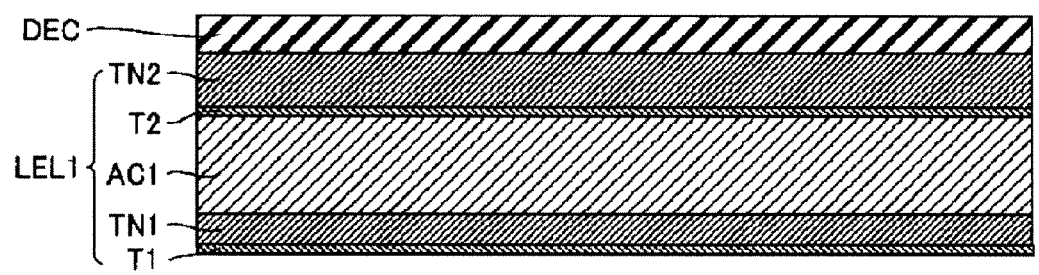
FIG. 10 is a schematic cross-sectional view showing an aspect of the second step of the method of manufacturing the semiconductor device of FIG. 2.

Referring to FIG. 10, next, the dielectric layer DEC is stacked. As the dielectric layer DEC, a thin film of silicon nitride, which is formed by P-CVD (plasma CVD), for example, is formed.

Figure 11:
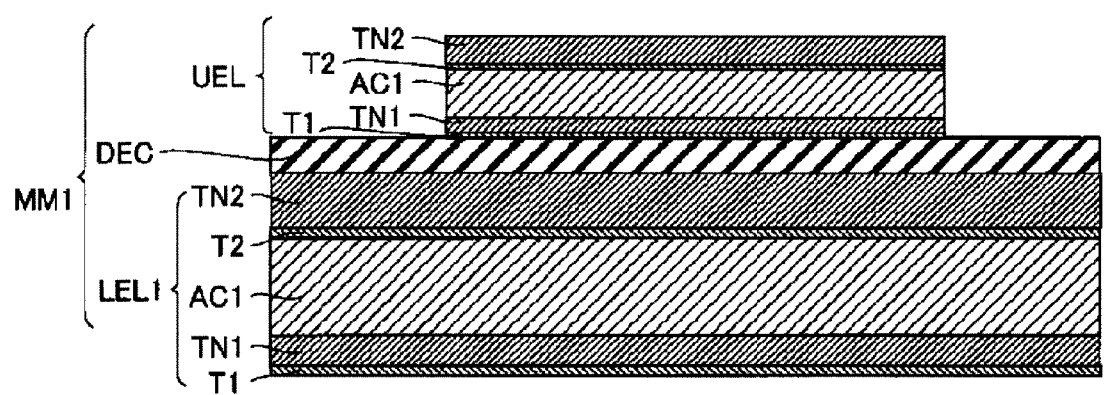
FIG. 11 is a schematic cross-sectional view showing an aspect of the third step of the method of manufacturing the semiconductor device of FIG. 2.

Referring to FIG. 11, with the same method as in the lower electrode LEL1, the titanium layer T1, the titanium nitride layer TN1, the aluminum alloy layer AC1, the titanium layer T2, and the titanium nitride layer TN2 as the upper electrode UEL are stacked in this order. It should be noted that, also here, preferably, after depositing the aluminum alloy layer AC1, the reflow process is performed to recrystallize the crystal of aluminum. Moreover, when the area in the plane view of the upper electrode UEL is made smaller than the area in the plane view of the lower electrode LEL1, it is preferable that after depositing the thin film constituting the upper electrode UEL, a process of forming the upper electrode UEL of a desired area using an ordinary photolithography technique, for example, is performed. In this manner, the capacitor MM1 is formed.

Figure 12:
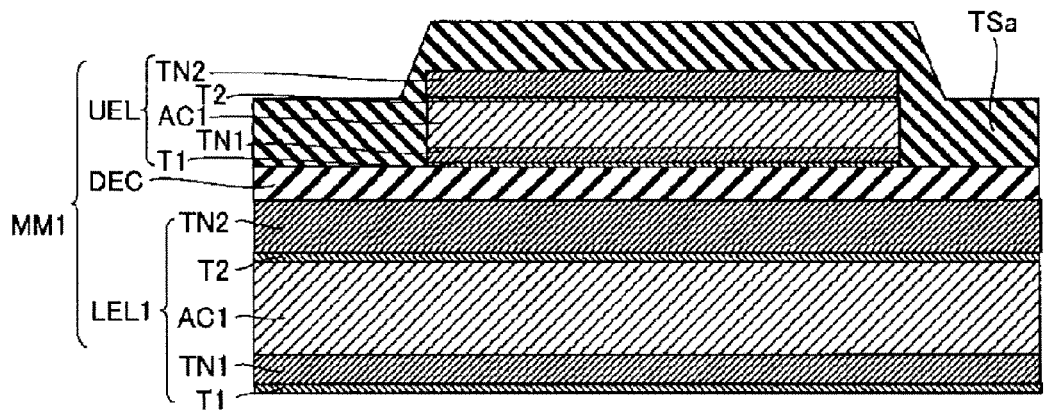
FIG. 12 is a schematic cross-sectional view showing an aspect of the fourth step of the method of manufacturing the semiconductor device of FIG. 2.

Referring to FIG. 12, next, an insulating film TSa is formed by HDP-CVD (High Density Plasma), for example.

Figure 13:
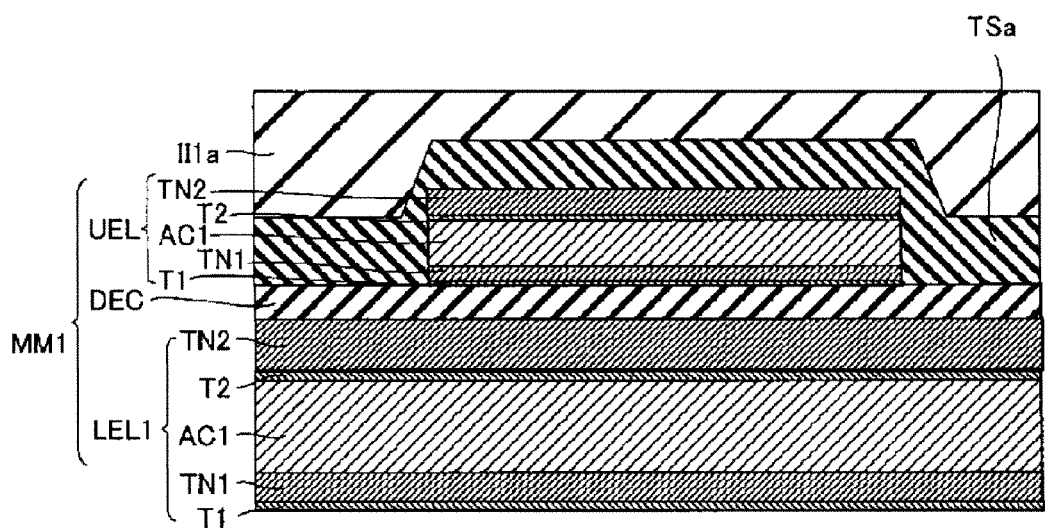
FIG. 13 is a schematic cross-sectional view showing an aspect of the fifth step of the method of manufacturing the semiconductor device of FIG. 2.

Referring to FIG. 13, next, the interlayer insulating film II1a comprising a silicone oxide film is formed by P-CVD, for example.

Figure 14:
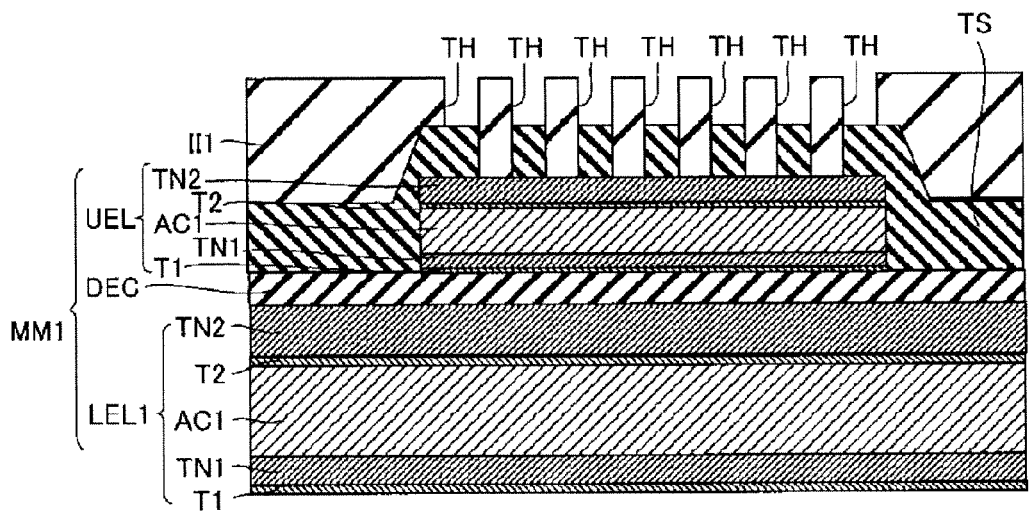
FIG. 14 is a schematic cross-sectional view showing an aspect of the sixth step of the method of manufacturing the semiconductor device of FIG. 2.

Referring to FIG. 14, for example, by removing a part of the insulating film TSa and interlayer insulating film II1a over the UEL, the vertically extending through-hole TH is formed. Through this process, the interlayer insulating film II1a shall serve as the interlayer insulating film II1 and the insulating film TSa shall serve as the insulating film TS.

Figure 15:
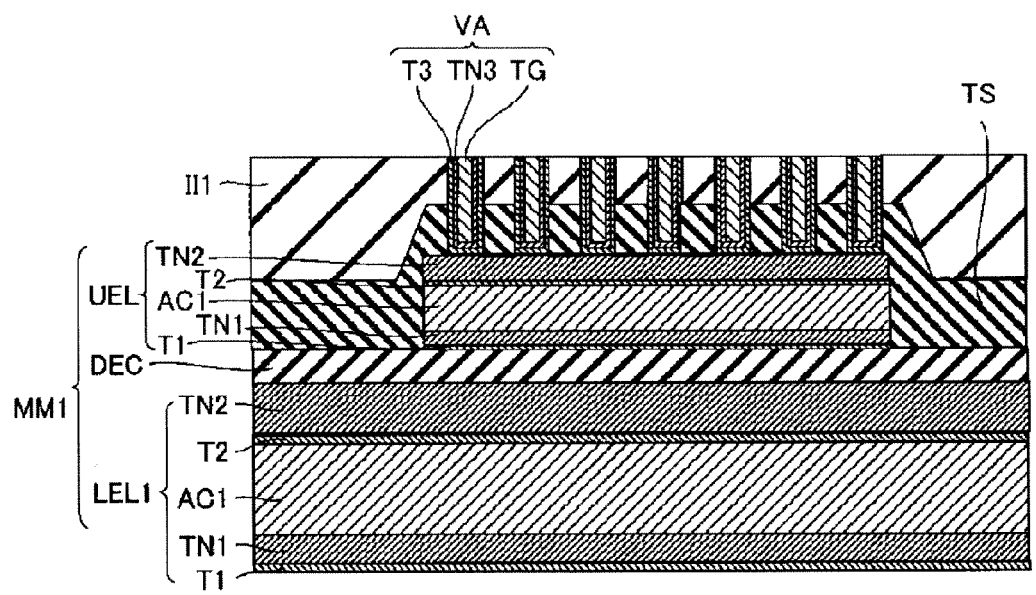
FIG. 15 is a schematic cross-sectional view showing an aspect of the seventh step of the method of manufacturing the semiconductor device of FIG. 2.

Referring to FIG. 15, over the interlayer insulating film II1 and inside the through-hole TH, the titanium layer T3 and the titanium nitride layer TN3 are formed by sputtering, for example. Subsequently, the tungsten layer TG is formed by CVD, for example. Subsequently, the surfaces of the deposited tungsten layer TG and titanium nitride layer TN3 are polished by CMP, for example. In this manner, as shown in FIG. 15, the conductive via VA, wherein the inside of the through-hole TH is filled with the titanium layer T3, titanium nitride layer TN3, and tungsten layer TG, is formed. Therefore, the thicknesses of the titanium layer T3 and the titanium nitride layer TN3 are preferably controlled so that the conductive via VA becomes in the form of FIG. 15.

Figure 16:
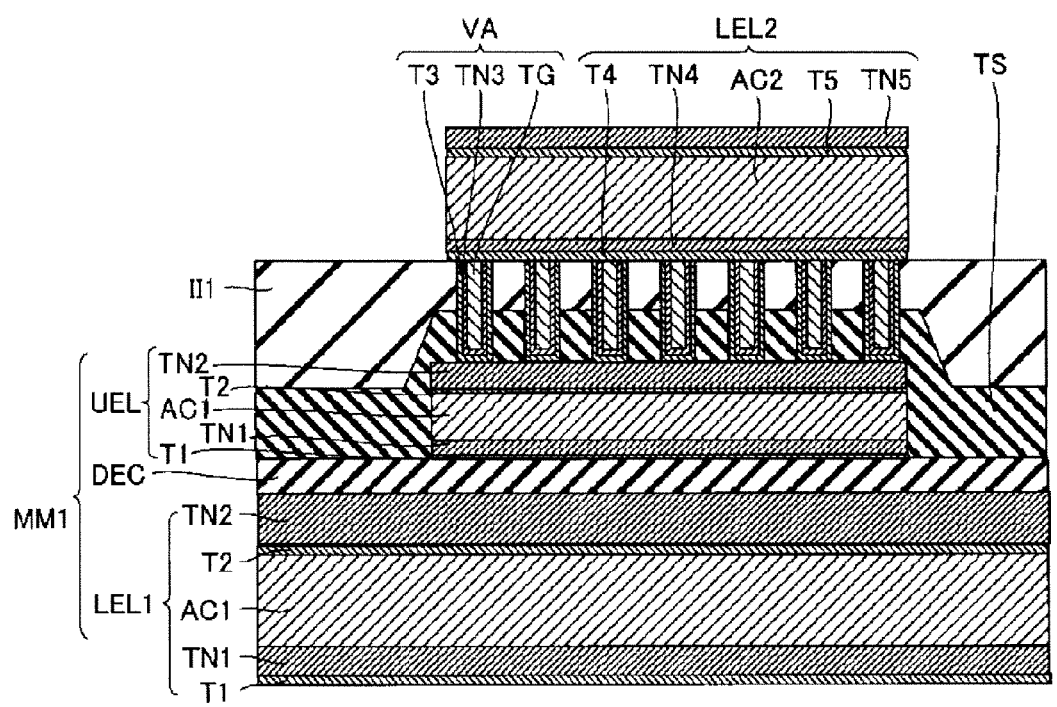
FIG. 16 is a schematic cross-sectional view showing an aspect of the eighth step of the method of manufacturing the semiconductor device of FIG. 2.

Referring to FIG. 16, over the interlayer insulating film II1 including the conductive via VA, each layer constituting the lower electrode LEL2 is formed by sputtering, for example. Subsequently, each layer constituting the lower electrode LEL2 is processed using a dry etching method, for example, resulting in the lower electrode LEL2 with a desired shape.

Figure 17:
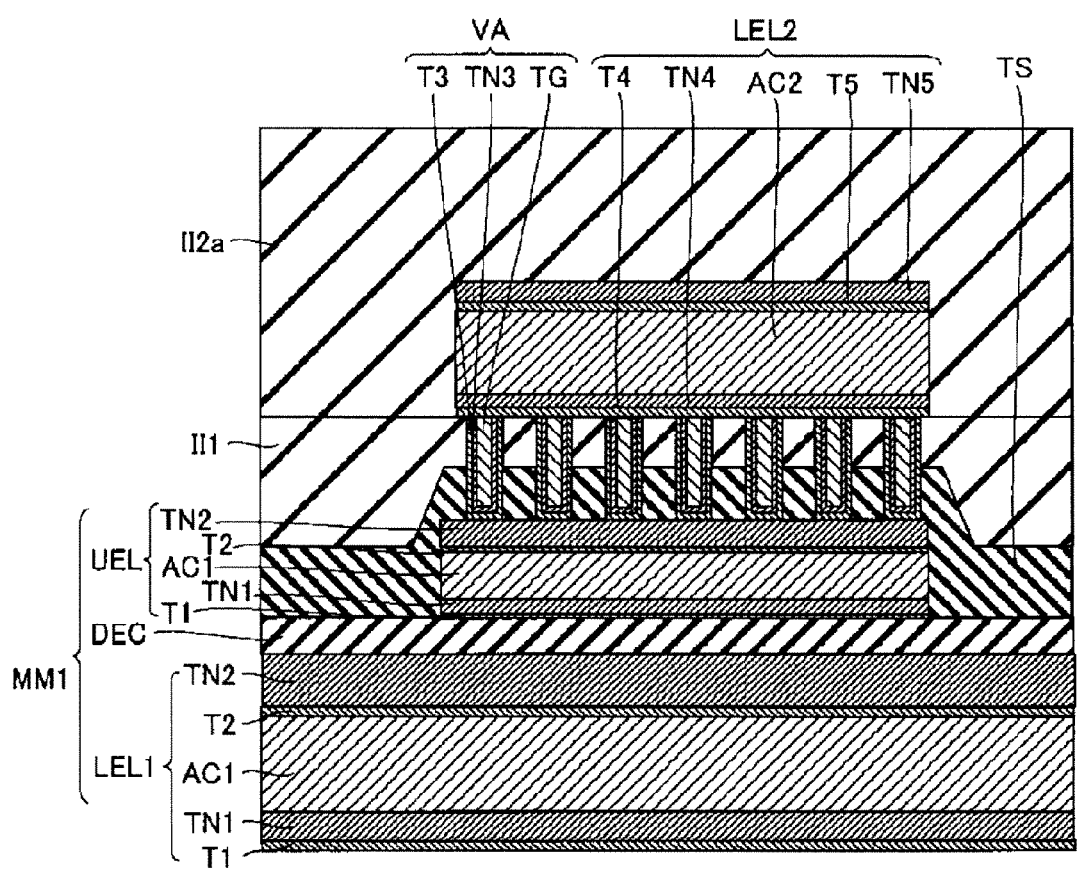
FIG. 17 is a schematic cross-sectional view showing an aspect of the ninth step of the method of manufacturing the semiconductor device of FIG. 2.

Referring to FIG. 17, subsequently, the interlayer insulating film II2a is formed so as to cover the upper surface of the interlayer insulating film II1 and lower electrode LEL2, by using a plasma CVD method, for example. Subsequently, the upper portion of the interlayer insulating film II2a is planarized by CMP, for example, resulting in the interlayer insulating film II2. In this manner, the form illustrated in FIG. 2 is completed.

Figure 18:
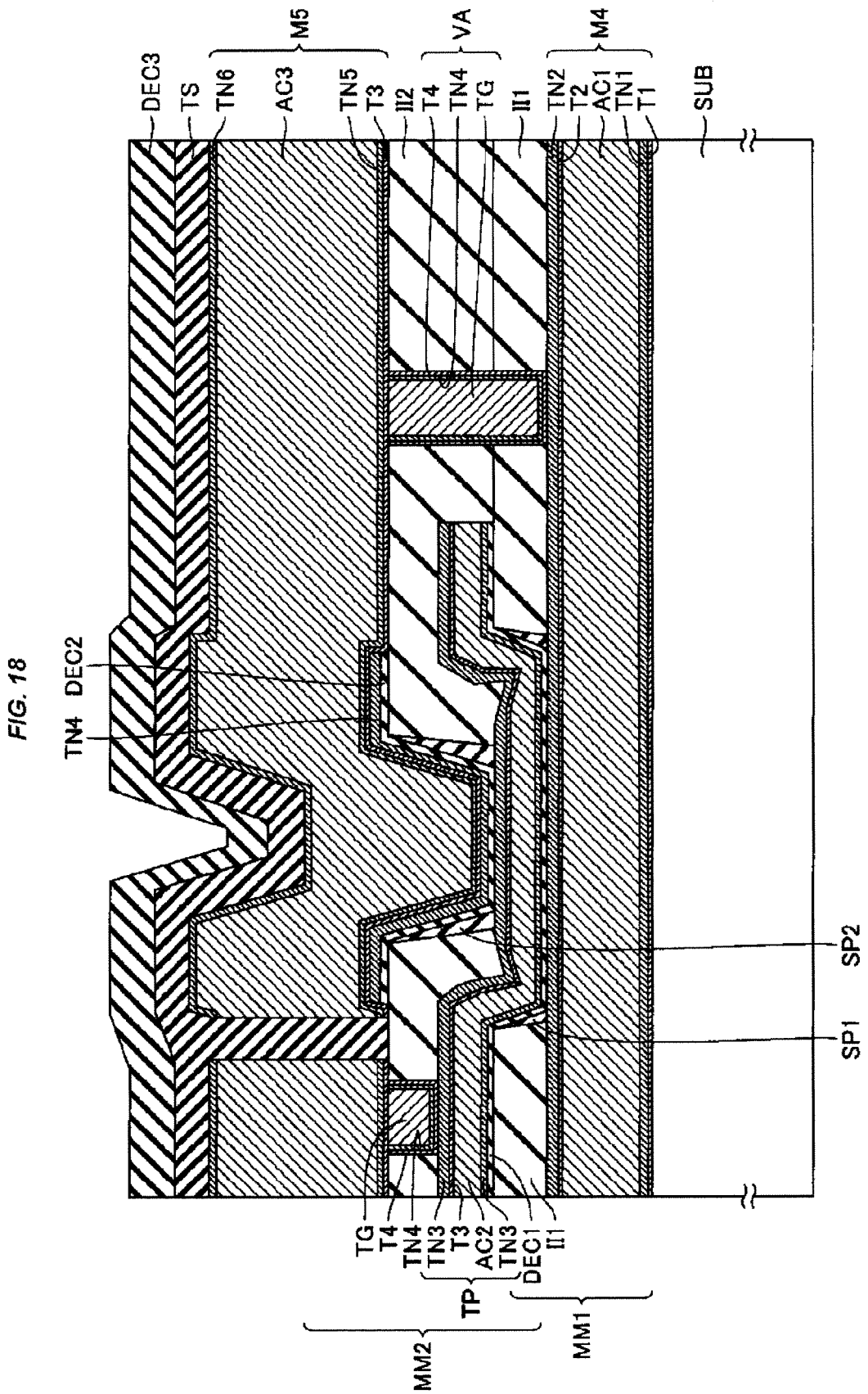
FIG. 18 is a schematic cross-sectional view showing an example of an alternative embodiment different from FIG. 2, of the configuration of the MIM capacitor mounted on the semiconductor device according to Embodiment 1 of the present invention.

It should be noted that, other than the capacitor MM1 having the above-described form illustrated in FIG. 2, the capacitor of this embodiment may have forms described below. Referring to FIG. 18, another semiconductor device of this embodiment includes two dielectric layers comprising a dielectric layer DEC1 and a dielectric layer DEC2. The dielectric layer DEC1 is sandwiched by a wiring M4 and a wiring TP. The wiring M4 corresponds to the lower electrode LEL1 of FIG. 2 and the wiring TP corresponds to the upper electrode UEL of FIG. 2. Therefore, the wiring M4, the dielectric layer DEC1, and the wiring TP form the capacitor MM1. Similarly, considering that the wiring TP corresponds to the lower electrode LEL1 of FIG. 2 and that the wiring M5 corresponds to the upper electrode UEL of FIG. 2, then the wiring TP, the dielectric layer DEC2, and the wiring M5 form the capacitor MM2.

The wiring M4, as with the lower electrode LEL1, comprises the titanium layer T1, the titanium nitride layer TN1, the aluminum alloy layer AC1, the titanium layer T2, and the titanium nitride layer TN2. The wiring TP comprises the aluminum alloy layer AC2, and the titanium nitride layers TN1, TN2 and titanium layers T1 and T2 thereover and thereunder. The wiring M5 comprises the aluminum alloy layer AC3, and the titanium nitride layers TN5 and TN6 and the titanium layer T3 thereover and thereunder.

A region, in which the wirings M4, TP, and M5 overlap with each other in the vertical direction across the dielectric layers DEC1, DEC2 in order to form the capacitors MM1 and MM2, is downwardly recessed in the cross-sectional view. Then, spacers SP1, SP2 comprising silicone oxide film (SiO), for example, are formed on the side of the recessed dielectric layer.

It should be noted that, in FIG. 18 described above, since a constituent element attached with the same numeral as that of FIG. 2 has the same configuration as that of FIG. 2, the repeated explanation thereof is omitted here. This is true of the cases where only the last number of a reference numeral differs and the symbol thereof is the same.

Also in the aluminum alloy layers AC1, AC2, and AC3 in the semiconductor device illustrated in FIG. 18, it is preferable that the reflow process is performed after depositing this and that the crystal constituting the aluminum alloy layer is crystallized. Preferably, with this recrystallization, Rmax (maximum height) of each surface of the aluminum alloy layers AC1, AC2, and AC3 becomes less than 80 nm, Rms (root-mean-square roughness) becomes less than 10 nm, and Ra (arithmetic average roughness) becomes less than 9 nm.

Next, the operational effects of this embodiment are described. If the surface roughness of the aluminum alloy layer of the capacitor improves as described above (i.e., if the surface flatness improves), the variation in the film thickness of the individual capacitor mounted on the semiconductor device or the variation in the performances, such as the capacitance, can be suppressed. Such a surface can be realized by performing recrystallization through the reflow process in forming the aluminum alloy layer. Accordingly, the breakdown voltage of the individual capacitor is further stabilized and the reliability of the semiconductor device improves.

The once deposited aluminum alloy layer AC1 is reflowed at a high temperature for recrystallization. For this reason, the flatness of the aluminum alloy layer AC1 and the upper portion thereof (the dielectric layer DEC and the upper electrode UEL) can be improved regardless of the stacking method of the first aluminum alloy layer AC1 on the lower side of the barrier layer or the flatness of the first barrier layer. Because the major portion of the lower electrode LEL1 is the aluminum alloy layer AC1, the flatness of the surface of the aluminum alloy layer AC1 improves and thus the flatness of the entire capacitor MM1 improves. As a result, the variation in the film thickness or the like of the capacitor MM1 decreases. Accordingly, failures, such as an initial failure of the capacitor MM1, can be suppressed and the reliability can be improved.

The above-described process of planarizing the surface of the aluminum alloy layer by reflow is performed in forming the lower electrode LEL1 itself, in this embodiment. After forming the aluminum alloy layer, the second barrier layer constituting the lower electrode LEL1 is formed. For this reason, in this embodiment, before the formation of the lower electrode LEL1 itself is completed, the process for improving the flatness is performed. That is, this embodiment is a method of forming the lower electrode LEL1 itself flat. Accordingly, as compared with, for example, a case where the method of planarizing after the formation of the lower electrode LEL1 itself is completed is used, the cost required for the planarization process can be reduced.

Moreover, if the (111) orientation strength of the aluminum alloy layer improves due to the recrystallization, the life of the aluminum alloy layer is improved. This is because the electromigration life of aluminum crystal is proportional to a logarithm of the diffraction peak intensity in XRD (X-Ray Diffraction) of the (111) plane. Also from this, the reliability of the wirings of the capacitor can be further increased.

As described above, by planarizing the surface of the aluminum alloy layer AC1 of the lower electrode LEL1, the entire capacitor can be planarized and the reliability thereof can be secured. Furthermore, also with respect to the aluminum alloy layer AC1 of the upper electrode UEL, if the process similar to the one performed on the lower electrode LEL1 is performed to planarize so that the surface thereof satisfies a relationship of Rmax<80 nm, Rms<10 nm, and Ra<9 nm, then in forming a multi-stage stacked structure of the capacitor MM1, an increase in the capacity can be achieved more stably.

Embodiment 2

This embodiment differs from Embodiment 1 in the method of planarizing the surface of the aluminum alloy layer. Now, this embodiment is described.

In this embodiment, for example, the first barrier layer (the titanium layer T1 and the titanium nitride layer TN1) constituting the lower electrode LEL1 of FIG. 2 is formed by a high-directive sputtering method. Specifically, for example, the high-directivity sputtering method, such as a collimation sputtering method, a long throw sputtering method, a sputter ion pump method, or a bias sputtering method, is used. In contrast, in Embodiment 1, the first barrier layer is formed by an ordinary sputtering method which is not the high-directivity sputtering method.

This embodiment differs from Embodiment 1 in the points described above. However, the manufacturing method of the capacitor MM1 illustrated particularly in FIG. 2 of a semiconductor device according to this embodiment comprises basically the same steps as those of the manufacturing method of the semiconductor device according to Embodiment 1 shown in FIGS. 9 to 17.

Here, the operational effects of this embodiment are described. The titanium layer T1 or titanium nitride layer TN1 formed by the above-described various high-directivity sputtering methods has an improved (111) orientation strength as compared with the titanium layer T1 and titanium nitride layer TN1 formed by an ordinary sputtering method. If the orientation strength of the titanium layer T1 or titanium nitride layer TN1 improves, the orientation strength of the aluminum alloy layer AC1, and the titanium layer T2 and the titanium nitride layer TN2 as the second barrier layer formed thereover also improves in accordance with the lower titanium layer T1 or titanium nitride layer TN1. Accordingly, the flatness of the entire lower electrode LEL1 improves and furthermore the flatness of the dielectric layer DEC or upper electrode UEL there thereover also improves. For this reason, also with regard to the capacitor MM1 of this embodiment, the possibility of an initial failure can be reduced and the reliability can be increased as with the capacitor MM1 of Embodiment 1.

By improving the flatness of only the titanium layer T1 or the like as the first barrier layer in this manner, the flatness of the aluminum alloy layer AC1 or the like thereover can be improved. For this reason, in this embodiment, even if the reflow process, such as the one in Embodiment 1, is not performed, the flatness of the surface of the aluminum alloy layer AC1 can be improved. However, also in this embodiment, the reflow process may be performed on the formed aluminum alloy layer AC1.

Moreover, if the first barrier layer is formed by the high-directivity sputtering method and thus the flatness of the aluminum alloy layer AC1 thereover can be improved, the (111) orientation strength of the aluminum alloy layer improves as described later. Accordingly, also in this embodiment, as with Embodiment 1, the life of the aluminum alloy layer is improved. Also from this, the reliability of the wirings of the capacitor can be further improved.

The above-described process of planarizing the surface of the aluminum alloy layer is performed in forming the lower electrode LEL1 itself, also in this embodiment. More specifically, in forming the first barrier layer itself, which is firstly formed in forming the lower electrode LEL1, the process of planarizing the surface of the aluminum alloy layer, which is to be formed later, is performed. For this reason, also in this embodiment, before the formation of the lower electrode LEL1 itself is completed, the process of improving the flatness has been already performed. That is, this embodiment is a method of forming the lower electrode LEL1 itself flat. Accordingly, as compared with, for example, a case where the method of planarizing after the formation of the lower electrode LEL1 itself is completed is used, the cost required for the planarization process can be reduced.

Moreover, also with regard to the upper electrode UEL or lower electrode LEL2, as with the lower electrode LEL1, the titanium layer T1 and titanium nitride layer TN1 on the lower portion of the aluminum alloy layer AC1 are preferably formed by the high-directive sputtering method. In this manner, as with Embodiment 1, in forming a multi-stage stacked structure of the MIM capacitor, such as the capacitor MM1, an increase in the capacity can be achieved more stably.

Embodiment 2 according to the present invention differs from Embodiment 1 only in the above-described points. That is, all the configuration, the conditions, the procedure, the effects, and the like of Embodiment 2 according to the present invention, which have not been described above, follow those of Embodiment 1.

Embodiment 3

This embodiment differs from Embodiment 1 in the method of planarizing the surface of the aluminum alloy layer. Hereinafter, this embodiment is described.

In this embodiment, in sputtering for forming the aluminum alloy layer AC1, the semiconductor substrate SUB (see FIG. 2, FIG. 9) is kept at lower temperature than usual. Specifically, the aluminum alloy layer AC1 is formed by sputtering aluminum while the semiconductor substrate SUB is kept in a range from 100° C. to 270° C. It should be noted that the same process as described above may be performed also on the aluminum alloy layer AC1 of the upper electrode UEL or on the aluminum alloy layer AC2 of the lower electrode LEL2.

Moreover, as required, the aluminum alloy layer AC1 which is formed under the above-described low temperature condition may be kept under a higher temperature environment after the formation. In this manner, the reliability of the formed electrode (aluminum alloy layer) can be further increased.

This embodiment differs from Embodiment 1 in the point described over. However, the manufacturing method of the capacitor MM1 illustrated particularly in FIG. 2 of the semiconductor device according to this embodiment comprises basically the same steps as those of the manufacturing method of the semiconductor device according to Embodiment 1 shown in FIGS. 9 to 17.

Moreover, the feature of at least one of Embodiment 1 and Embodiment 2 may be added to this embodiment and used.

Here, the operational effects of this embodiment are described. Usually, in depositing the aluminum alloy layer AC1 of the lower electrode LEL1, the semiconductor substrate SUB is heated to a range from 300° C. to 400° C., for example. However, like this embodiment, if the aluminum alloy layer AC1 of the lower electrode LEL1 is deposited while being heated at a low temperature in a range from 100° C. to 200° C., the grain growth of the crystal grain of aluminum in the formed aluminum alloy layer AC1 is suppressed. For this reason, the size of the crystal grain of the aluminum in the aluminum alloy layer AC1 decreases and the unevenness of the deposited aluminum is reduced. That is, as a result of a reduction in the size of the crystal grain of aluminum, the flatness of the surface of the aluminum alloy layer AC1 is improved. For this reason, also with regard to the capacitor MM1 of this embodiment, the possibility of an initial failure can be reduced and the reliability can be increased as with the capacitor MM1 of Embodiment 1. Also here, as with Embodiment 1, the flatness of the lower electrode LEL1 can be improved regardless of the stacking method of the first aluminum alloy layer AC1 on the lower side of the barrier layer or the flatness of the first barrier layer.

The above-described process of planarizing the surface of the aluminum alloy layer is performed in forming the lower electrode LEL1 itself, in this embodiment. More specifically, the aluminum alloy layer AC1 constituting the lower electrode LEL1 is formed in the state where the surface is already planarized. For this reason, also in this embodiment, before the formation of the lower electrode LEL1 itself is completed, the process of improving the flatness has been already performed. That is, this embodiment is a method of forming the lower electrode LEL1 itself flat. Accordingly, as compared with, for example, a case where the method of planarizing after the formation of the lower electrode LEL1 itself is completed is used, the cost required for the planarization process can be reduced.

Moreover, also with regard to the upper electrode UEL or lower electrode LEL2, as with the lower electrode LEL1, the aluminum alloy layers AC1, AC2 are preferably formed by the low-temperature sputtering method. In this manner, as with Embodiment 1, in forming a multi-stage stacked structure of the MIM capacitor, such as the capacitor MM1, an increase in the capacity can be achieved more stably.

Embodiment 3 according to the present invention differs from Embodiment 1 only in the above-described points. That is, all the configuration, the conditions, the procedure, the effects, and the like of Embodiment 3 according to the present invention, which have not been described over, follow those of Embodiment 1.

the titanium layer T1 and titanium nitride layer TN1 as the first barrier layer constituting the lower electrode LEL1 and the aluminum alloy layer AC1 thereover are formed, the surface being observed by AFM. Either one of these stacked structures is formed over the thin film and interlayer insulating film which are formed, under all the same conditions, over one of the major surfaces of the semiconductor substrate SUB.

Figure 19:
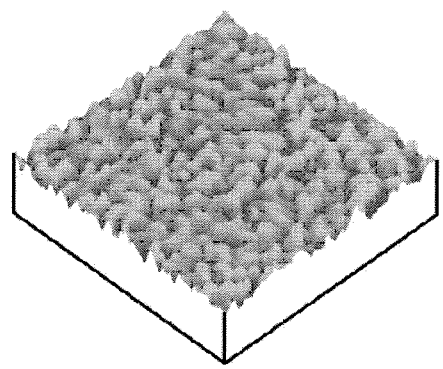
FIG. 19 is an observation result of the surface of an aluminum alloy layer formed over a barrier layer which is formed by an ordinary sputtering method.

The titanium layer T1 and the titanium nitride layer TN1 of FIG. 19 are formed by an ordinary sputtering method. The titanium layer T1 and the titanium nitride layer TN1 of FIG. 20 are formed by the sputter ion pump method among the high-directivity sputtering methods of Embodiment 2.

Figure 20:
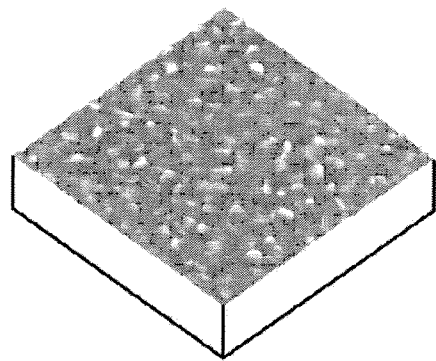
FIG. 20 is an observation result of the surface of the aluminum alloy layer formed over the barrier layer which is formed by a high-directive sputtering method.

Comparison between FIG. 19 and FIG. 20 reveals that the surface flatness of the aluminum alloy layer AC1 formed over the barrier layer, which is formed using the high-directive sputtering method like in this embodiment, has been improved further than the aluminum alloy layer AC1 formed over the barrier layer which is formed by an ordinary sputtering method.

Example 2

Changes in the flatness of the aluminum alloy layer AC1 caused by execution of the reflow process shown in Embodiment 1 were investigated. The forming conditions of each prepared sample and the measurement result of the surface of the aluminum alloy layer AC1 with the use of AFM are shown in Table 1 below.

TABLE 1

| sample number | sputtering method and thickness of formed Ti (DC power/ bias power) | sputtering method and thickness of formed Ti (DC power/ bias power) | thickness of AlCu (temperature/ deposition condition) | surface roughness evaluated by AFM | | |
|---|---|---|---|---|---|---|
| | | | | Rms (nm) | Ra (nm) | Rmax (nm) |
| #01 | ordinary sputtering method 10 nm (1 kw/0 W) | ordinary sputtering method 20 nm (6.5 kw/0 W) | 150 nm (300° C./ deposition only) | 11.71 | 9.318 | 87.01 |
| #02 | LTS sputtering 10 nm (6 kW/0 W) | LTS sputtering 20 nm (18 kW/0 W) | 150 nm (140° C./ reflow) | 1.906 | 1.419 | 25.03 |
| #03 | SIP sputtering 10 nm (6 kW/300 W) | SIP sputtering 15 nm (18 kW/50 W) | | 2.340 | 1.812 | 22.59 |
| #04 | ordinary sputtering method 10 nm (1 kW/0 W) | ordinary sputtering method 10 nm (6.5 kW/0 W) | | 3.441 | 2.575 | 37.26 |

Example 1

The surface of the aluminum alloy layer AC1 subjected to the planarizing process according to the present invention, the aluminum alloy layer AC1 constituting the lower electrode LEL1 of the capacitor MM1 and the surface of the aluminum alloy layer AC1 not subjected to the planarizing process according to the present invention were measured using anatomic force microscope (AFM; Atomic Force Microscope). The results of the measurement are shown in FIG. 19 and FIG. 20.

Either one of FIG. 19 and FIG. 20 shows the surface of the aluminum alloy layer AC1 in the stacked structure, in which In either one of Samples (sample number #01–#04) shown in Table 1, the titanium layer T1 (Ti), the titanium nitride layer TN1 (TiN), and the aluminum alloy layer AC1 (AlCu) were formed so as to stack in this order over the thin film and interlayer insulating film, which were formed under all the same conditions, over one of the major surfaces of the semiconductor substrate SUB.

For Samples #01 and #04, the titanium layer T1 and the titanium nitride layer TN1 shown in Table 1 were formed by an ordinary sputtering method. The values of the DC power and the bias power used in sputtering are as shown in Table 1, respectively.

In contrast, for Sample #02, the titanium layer T1 and the titanium nitride layer TN1 were formed by LTS (long through sputtering method) among the high-directivity sputtering methods. For Sample #03, the titanium layer T1 and the titanium nitride layer TN1 were formed by SIP (the sputter ion pump method) among the high-directivity sputtering methods.

For Sample #01, the aluminum alloy layer AC1 formed over the barrier layer was formed in the thickness of 150 nm by an ordinary sputtering method at 300° C. Then, only deposition was performed but the reflow process after the deposition was not performed. On the other hand, the aluminum alloy layer AC1 of Samples #02, #03, and #04 was formed in the thickness of 150 nm by an ordinary sputtering method at 140° C. In addition, the reflow process was performed after the deposition.

Figure 21:
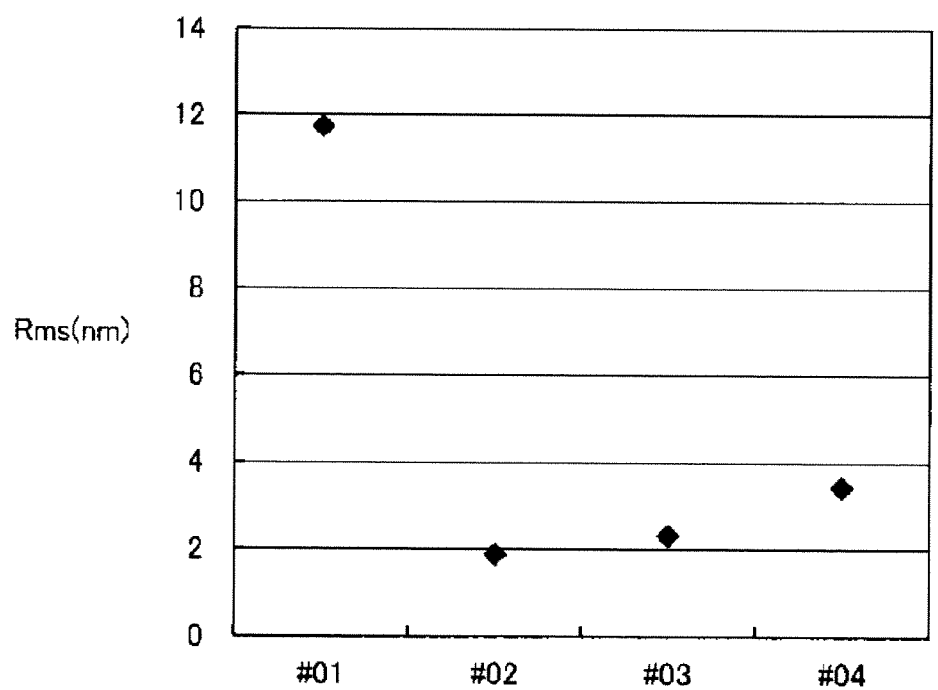
FIG. 21 is a graph showing a result of measuring Rms of the surface of the aluminum alloy layer when both the deposition method of the first barrier layer and the deposition method of the aluminum alloy layer are changed.
Figure 22:
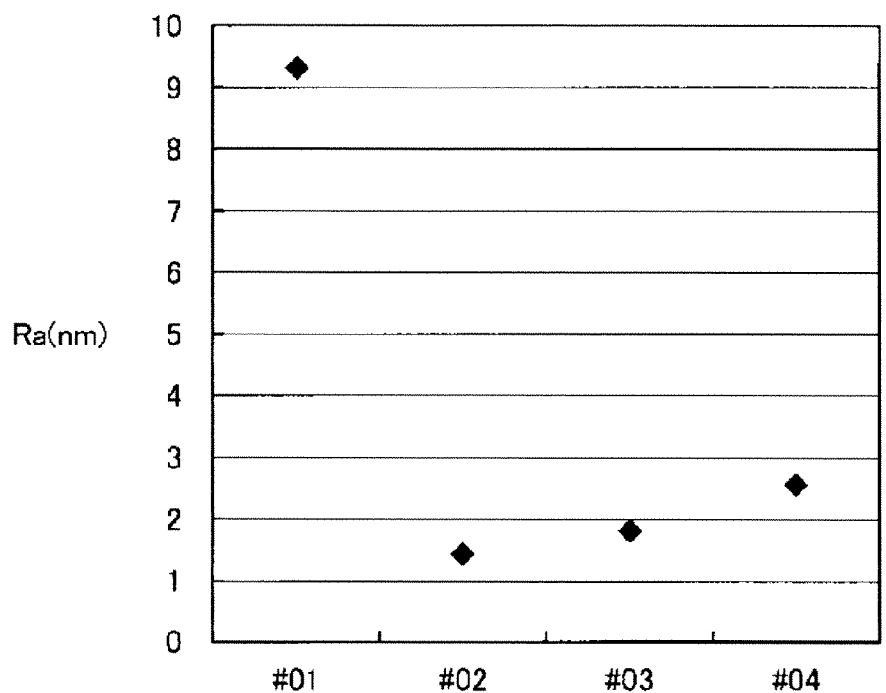
FIG. 22 is a graph showing a result of measuring Ra of the surface of the aluminum alloy layer when both the deposition method of the first barrier layer and the deposition method of the aluminum alloy layer are changed.
Figure 23:
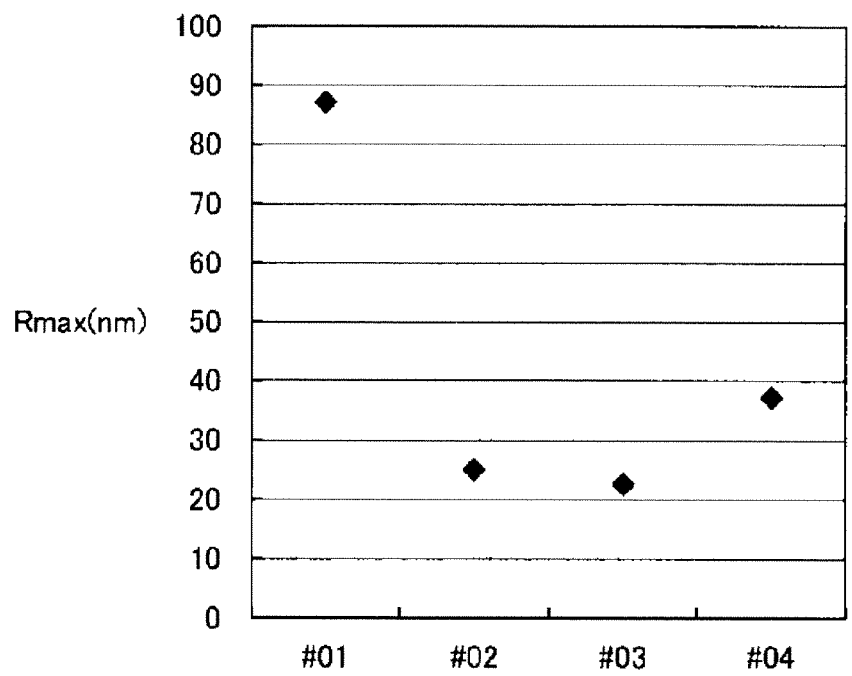
FIG. 23 is a graph showing a result of measuring Rmax of the surface of the aluminum alloy layer when both the deposition method of the first barrier layer and the deposition method of the aluminum alloy layer are changed.

These results of measuring the values of Rms, Ra, and Rmax of the surface of the aluminum alloy layer AC1 of each sample by AFM are shown in Table 1 and FIGS. 21 to 23. It should be noted that the horizontal axis of FIGS. 21 to 23 represents the type of the sample in Table 2, while the vertical axis of FIGS. 21 to 23 represents the value of each parameter indicative of the surface roughness.

Table 1 and FIGS. 21 to 23 reveal that if the reflow process is performed on the aluminum alloy layer AC1, high surface roughness can be obtained regardless of whether the first barrier layer is formed by the high-directivity sputtering method or not. Moreover, in Sample #02 to #04, the aluminum alloy layer AC1 was deposited at lower temperature as compared with Sample #01. From this fact, in Samples #02 to #04, the crystal grain might be minimized as compared with Sample #01, and as a result, the unevenness of the surface is minimized.

Example 3

In Example 3, the effect on the surface roughness of the aluminum alloy layer AC1 due to the use of the high-directivity sputtering method shown in Embodiment 2 was investigated in more detail than in Example 1. The forming conditions of each prepared sample and the measurement results of the surface of the aluminum alloy layer AC1 with the use of AFM are shown in Table 2 below.

film and interlayer insulating film, which were formed under all the same conditions, over one of the major surfaces of the semiconductor substrate SUB.

In either one of these samples, the titanium layer T1 and the like are formed over the surface on which sputter etching was performed by the depth of 15 nm. Then, for Samples #06 and #07, the titanium layer T1 or the titanium nitride layer TN1 is formed by an ordinary sputtering method. In contrast, for Samples #08 and #09, the titanium layer T1 and the titanium nitride layer TN1 were formed by LTS. For Samples #10 and #11, the titanium layer T1 and the titanium nitride layer TN1 were formed by SIP.

In this example, for all the samples, the aluminum alloy layer AC1 was formed at 300° C., which is the ordinary temperature, by the ordinary sputtering method. Then, a post-process, such as the reflow process, was not performed on the formed aluminum alloy layer AC1.

Figure 24:
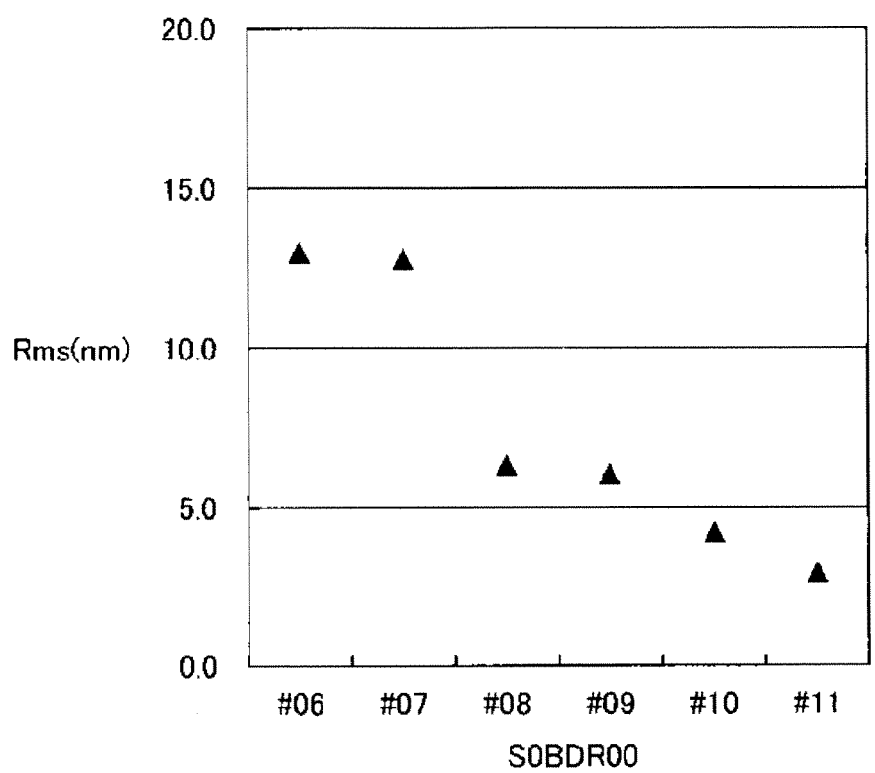
FIG. 24 is a graph showing a result of measuring Rms of the surface of the aluminum alloy layer when only the deposition method of the first barrier layer is changed.
Figure 25:
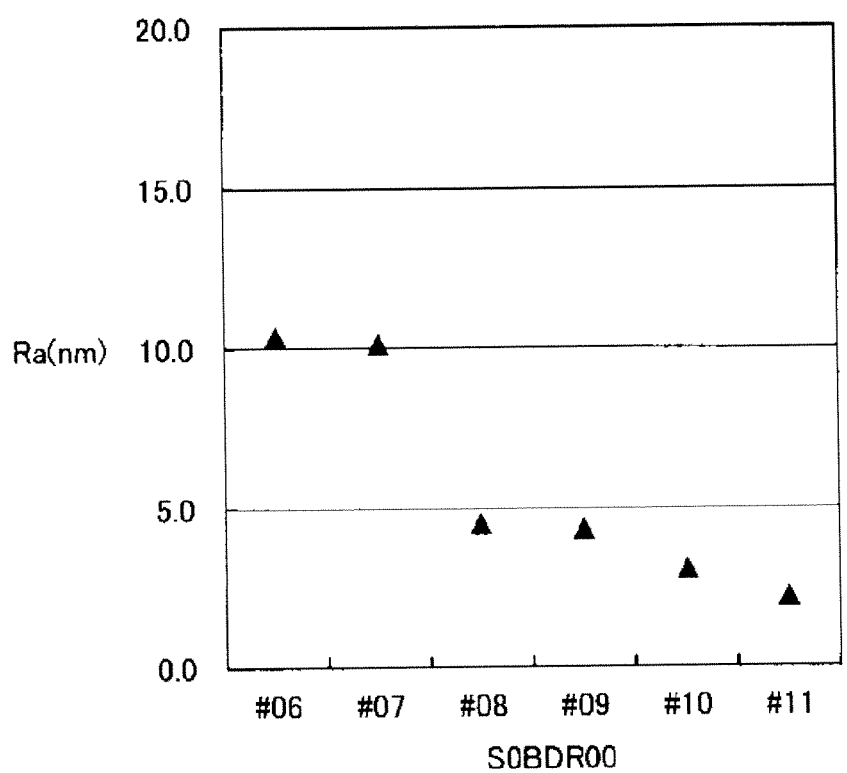
FIG. 25 is a graph showing a result of measuring Ra of the surface of the aluminum alloy layer when only the deposition method of the first barrier layer is changed.
Figure 26:
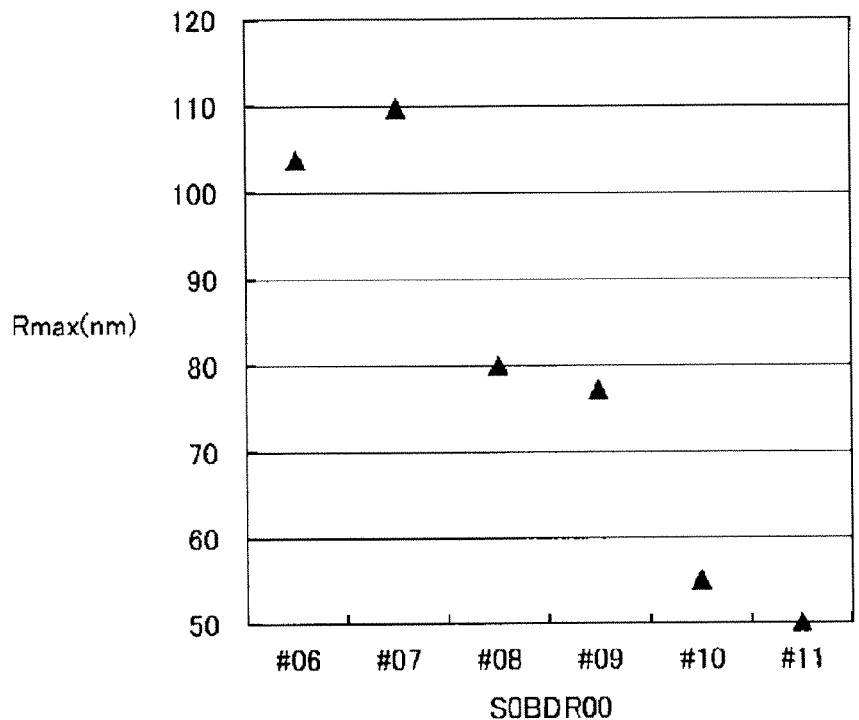
FIG. 26 is a graph showing a result of measuring Rmax of the surface of the aluminum alloy layer when only the deposition method of the first barrier layer is changed.

These results of measuring the values of Rms, Ra, and Rmax of the surface of the aluminum alloy layer AC1 of each sample with the use of AFM are shown in Table 2 and FIGS. 24 to 26. It should be noted that the horizontal axis and vertical axis of FIGS. 24 to 26 are the same as those of FIGS. 21 to 23.

That is, in this example, a difference in the condition among the respective samples is only the difference of the sputtering method in forming the barrier layer. In this case, as shown in Table 2 and FIGS. 24 to 26, the formation of the barrier layer using the high-directivity sputtering method turned out to improve the surface roughness of the subsequent aluminum alloy layer AC1 more than using an ordinary sputtering method.

To summarize the above FIGS. 21 to 26, it has been found that by using the planarizing process shown in this embodiment, Rmax becomes less than 80 nm (see FIG. 23, FIG. 26), Rms becomes less than 10 nm (see FIG. 21, FIG. 24), and as for the surface roughness of the aluminum alloy layer AC1, Ra becomes less than 9 nm (see FIG. 22, FIG. 25). That is, by setting the value of each parameter indicative of the flatness to the above-described range, the aluminum alloy layer AC1 with high flatness can be obtained. As a result, the lower

TABLE 2

| sample number | sputtering method | thickness of TiN (nm) | thickness of Ti (nm) | depth of sputter etching | thickness of AL (temperature/ deposition condition) | surface roughness evaluated by AFM | | |
|---|---|---|---|---|---|---|---|---|
| | | | | | | Rms (nm) | Ra (nm) | Rmax (nm) |
| #6 | ordinary method | 20 | 10 | 15 | 150 nm (300° C./ deposition only) | 13.0 | 10.3 | 103.7 |
| #7 | ordinary method | 10 | 10 | 15 | | 12.8 | 10.1 | 109.7 |
| #8 | LTS sputtering | 20 | 10 | 15 | | 6.3 | 4.5 | 79.9 |
| #9 | LTS sputtering | 10 | 10 | 15 | | 6.0 | 4.3 | 77.2 |
| #10 | SIP sputtering | 20 | 10 | 15 | | 4.2 | 3.0 | 55.0 |
| #11 | SIP sputtering | 10 | 10 | 15 | | 3.0 | 2.2 | 49.9 |

In either one of Samples (sample number #06 to #11) shown in Table 2, the titanium layer T1 (Ti), the titanium nitride layer TN1 (TiN), and the aluminum alloy layer AC1 (AlCu) were formed so as to stack in this order over the thin electrode LEL1 and the like with high flatness can be obtained, and therefore the semiconductor device having a small variation in the breakdown voltage and having a high reliability can be obtained.

Furthermore, it can be said that the aluminum alloy layer AC1 which is formed over the barrier layer by the high-directivity sputtering method has a higher (111) orientation strength of aluminum than the aluminum alloy layer AC1 which is formed over the barrier layer by an ordinary depositing method. Either of FIG. 27 and FIG. 28 shows the (111) orientation strength which the aluminum crystal in the aluminum alloy layer AC1 formed by an ordinary sputtering method exhibits.

Figure 27:
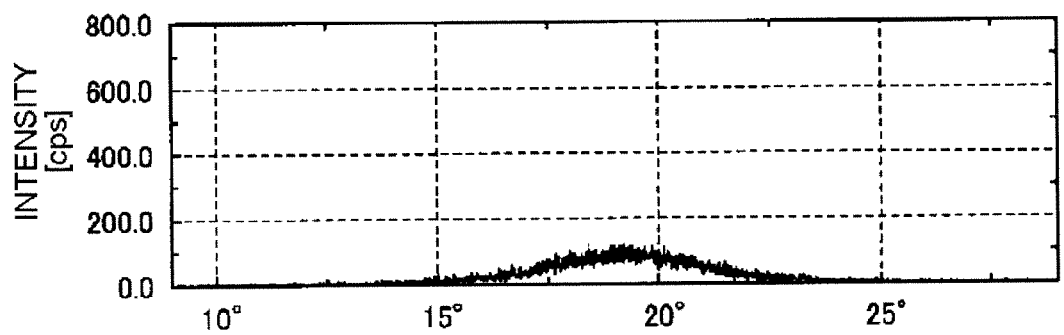
FIG. 27 is a graph showing a result of measuring, by X-ray diffraction, the Al (111) orientation strength of the aluminum alloy layer formed over the barrier layer which is formed by an ordinary sputtering method.
Figure 28:
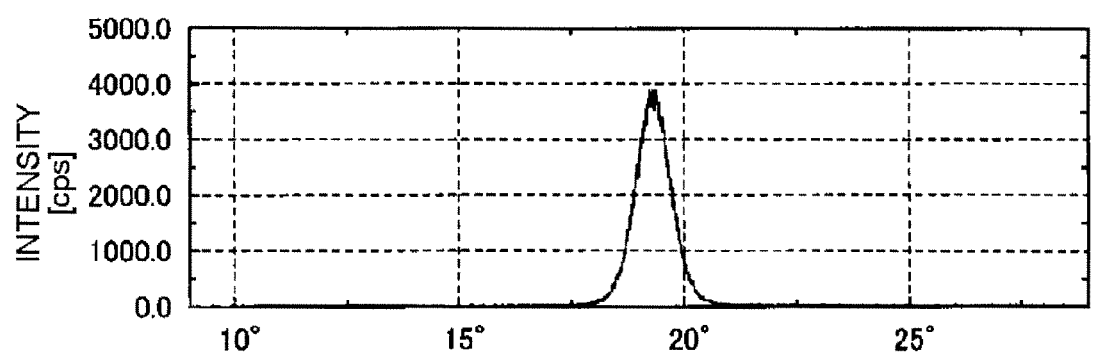
FIG. 28 is a graph showing a result of measuring, by X-ray diffraction, the Al (111) orientation strength of the aluminum alloy layer formed over the barrier layer which is formed by a high-directive sputtering method.

The difference between the samples used in the measurements in FIG. 27 and FIG. 28 is only the method of forming the titanium layer T1 and the titanium nitride layer TN1. The horizontal axis in the graphs of FIG. 27 and FIG. 28 represents the X-ray diffraction angle due to X-ray diffraction (XRD), while the vertical axis represents the (111) orientation strength of the aluminum crystal in the aluminum alloy layer AC1.

Referring to FIG. 27 and FIG. 28, it is found that for example, the aluminum alloy layer AC1 over the barrier layer which was formed by the high-directivity sputtering method like the one in Embodiment 2 has a higher (111) orientation strength than the aluminum alloy layer AC1 over the barrier layer which was formed by the ordinary sputtering method. That is, as described above, the orientation of (111) of the aluminum alloy layer AC1 can be improved not only when the reflow process is performed on the aluminum alloy layer AC1, but also by planarizing the barrier layer of the base of the aluminum alloy layer AC1. Accordingly, if the flatness of the surface of the aluminum alloy layer AC1 improves, it can be said that the orientation of the aluminum crystal in the aluminum alloy layer AC1 improves.

All the embodiments and examples disclosed here should be considered to be illustrative only in every respect but not restrictive. The scope of the present invention is indicated not by the aforementioned descriptions but by the scope of the appended claims. The scope of the present invention is intended to include the meaning equivalent to the appended claims and all the modification within the scope of the present inventions.

The present invention can be particularly advantageously applied to the semiconductor device including capacitors and the methods of manufacturing the same.

What is claimed is:

1. A semiconductor device, comprising:
a semiconductor substrate with a major surface;
a first metal electrode formed over the major surface of the semiconductor substrate;
a dielectric layer formed over the first metal electrode; and
a second metal electrode formed over the dielectric layer, wherein
the first metal electrode includes at least one first barrier layer, and a first aluminum layer containing aluminum formed over the first barrier layer, and wherein
a surface of the first aluminum layer satisfies a relationship of Rmax<80 nm, Rms<10 nm, and Ra<9 nm.

2. The semiconductor device according to claim 1, further comprising at least one second barrier layer formed over the first aluminum layer, wherein at least any of the first barrier layer and the second barrier layer includes a thin film comprising a material containing titanium.

3. The semiconductor device according to claim 1 or 2, wherein the second metal electrode includes at least one third barrier layer and a second aluminum layer formed over the third barrier layer, and wherein a surface of the second aluminum layer satisfies a relationship of Rmax<80 nm, Rms<10 nm, and Ra<9 nm.

4. A method of manufacturing a semiconductor device, comprising the steps of:
preparing a semiconductor substrate;
forming a first metal electrode including a first aluminum layer containing aluminum over one of major surfaces of the semiconductor substrate;
forming a dielectric layer over the first metal electrode; and
forming a second metal electrode over the dielectric layer, wherein
in the step of forming the first metal electrode, the first aluminum layer is formed so that a surface of the first aluminum layer satisfies a relationship of Rmax<80 nm, Rms<10 nm, and Ra<9 nm.

5. The method according to claim 4, wherein the step of forming the first metal electrode comprises the steps of:
forming at least one first barrier layer;
forming the first aluminum layer over the first barrier layer; and
recrystallizing a crystal constituting the first aluminum layer.

6. The method according to claim 5, wherein the recrystallization step further comprises the step of keeping the first aluminum layer at 420° C. or more.

7. The method according to any of claims 4 to 6, wherein the step of forming the first metal electrode comprises the steps of:
forming at least one first barrier layer; and
forming the first aluminum layer over the first barrier layer, wherein
the first barrier layer is formed by a high-directivity sputtering method.

8. The method according to claim 7, wherein any of a collimation sputtering method, a long throw sputtering method, and a bias sputtering method is used as the high-directivity sputtering method.

9. The method according to any of claims 4 to 8, further comprising the step of forming at least one second barrier layer over the first aluminum layer.

* * * * *